United States Patent
Yasuda

(10) Patent No.: US 11,329,629 B2
(45) Date of Patent: May 10, 2022

(54) ACOUSTIC WAVE DEVICE AND METHOD OF MANUFACTURING THE SAME

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/548,896

(22) Filed: Aug. 23, 2019

(65) Prior Publication Data

US 2019/0379354 A1    Dec. 12, 2019

Related U.S. Application Data

(63) Continuation of application No. PCT/JP2018/000633, filed on Jan. 12, 2018.

(30) Foreign Application Priority Data

Feb. 28, 2017    (JP) .............................. JP2017-036180

(51) Int. Cl.
*H03H 9/72*    (2006.01)
*H01Q 5/30*    (2015.01)
(Continued)

(52) U.S. Cl.
CPC .............. *H03H 9/725* (2013.01); *H01Q 5/30* (2015.01); *H03H 3/08* (2013.01);
(Continued)

(58) Field of Classification Search
CPC ...... H03H 9/725; H03H 9/24; H03H 9/02637; H03H 9/059; H03H 9/1092; H03H 9/145;
(Continued)

(56) References Cited

U.S. PATENT DOCUMENTS

2003/0038562 A1* 2/2003 Ikada ..................... H03H 9/145
                                                          310/313 B
2003/0169129 A1    9/2003 Takamine
(Continued)

FOREIGN PATENT DOCUMENTS

JP    2002-299996 A    10/2002
JP    2003-289234 A    10/2003
(Continued)

OTHER PUBLICATIONS

Official Communication issued in International Patent Application No. PCT/JP2018/000633, dated Mar. 20, 2018.

*Primary Examiner* — Samuel S Outten
(74) *Attorney, Agent, or Firm* — Keating & Bennett, LLP

(57) ABSTRACT

An acoustic wave device includes a piezoelectric substrate, a first band pass filter that is on the piezoelectric substrate and has a first pass band, and a second band pass filter that is on the piezoelectric substrate and has a second pass band at a higher frequency than the first pass band. The first and second band pass filters include resonators that include respective IDT electrodes. When a first total average metallization ratio is defined as an average of metallization ratios of all of the IDT electrodes included in the first filter and a second total average metallization ratio is defined as an average of metallization ratios of all of the IDT electrodes included in the second filter, the first total average metallization ratio is greater than the second total average metallization ratio.

15 Claims, 4 Drawing Sheets

(51) Int. Cl.
*H03H 9/02* (2006.01)
*H03H 9/05* (2006.01)
*H03H 9/10* (2006.01)
*H03H 9/145* (2006.01)
*H03H 9/25* (2006.01)
*H03H 9/64* (2006.01)
*H03H 3/08* (2006.01)

(52) U.S. Cl.
CPC ........ *H03H 9/02637* (2013.01); *H03H 9/059* (2013.01); *H03H 9/1092* (2013.01); *H03H 9/145* (2013.01); *H03H 9/25* (2013.01); *H03H 9/6433* (2013.01)

(58) Field of Classification Search
CPC .......... H03H 9/25; H03H 9/6433; H03H 3/08; H01Q 5/30
See application file for complete search history.

(56) References Cited

U.S. PATENT DOCUMENTS

| | | | |
|---|---|---|---|
| 2005/0285475 A1* | 12/2005 | Yokota | H03H 9/0576 |
| | | | 310/313 B |
| 2010/0097161 A1 | 4/2010 | Nakamura et al. | |
| 2017/0005637 A1 | 1/2017 | Nakamura | |
| 2018/0013405 A1 | 1/2018 | Takata | |
| 2018/0323769 A1* | 11/2018 | Yamamoto | H03H 9/25 |
| 2020/0287523 A1* | 9/2020 | Urata | H03H 9/1085 |

FOREIGN PATENT DOCUMENTS

| | | |
|---|---|---|
| JP | 2013-081068 A | 5/2013 |
| JP | 2017-017520 A | 1/2017 |
| WO | 2008/059780 A1 | 5/2008 |
| WO | 2016/174938 A1 | 11/2016 |

\* cited by examiner

ACOUSTIC WAVE DEVICE AND METHOD OF MANUFACTURING THE SAME

CROSS REFERENCE TO RELATED APPLICATIONS

This application claims the benefit of priority to Japanese Patent Application No. 2017-036180 filed on Feb. 28, 2017 and is a Continuation Application of PCT Application No. PCT/JP2018/000633 filed on Jan. 12, 2018. The entire contents of each application are hereby incorporated herein by reference.

BACKGROUND OF THE INVENTION

1. Field of the Invention

The present invention relates to an acoustic wave device and to a method of manufacturing the acoustic wave device.

2. Description of the Related Art

Duplexers and dual filters are surface acoustic wave devices including multiple high frequency filters for different communication bands. The duplexers and the dual filters are used in devices such as mobile phones. A duplexer is described in Japanese Unexamined Patent Application Publication No. 2003-289234 as an example of such an acoustic wave device. More specifically, Japanese Unexamined Patent Application Publication No. 2003-289234 discloses the duplexer as a surface acoustic wave device that is equipped, on a single piezoelectric substrate, with a high frequency filter having a higher pass band of which the center frequency is relatively high and a low frequency filter having a lower pass band of which the center frequency is relatively low.

Size reduction of acoustic wave devices has been increasingly demanded in recent years. However, in a known acoustic wave device, the chip size of an acoustic wave device is determined by the size of a resonator device extending in the propagation direction of acoustic wave. Accordingly, the chip size cannot be reduced sufficiently without sacrificing a certain level of performance. On the other hand, in a case of assembling a filter by using chips of limited size, a problem of deterioration of characteristics, such as insertion loss, has occurred.

SUMMARY OF THE INVENTION

Preferred embodiments of the present invention provide acoustic wave devices of which the size thereof is able to be reduced and methods of manufacturing the acoustic wave devices that are able to improve production efficiency.

According to a preferred embodiment of the present invention, an acoustic wave device includes a substrate having piezoelectricity, a first filter that is provided on the substrate having piezoelectricity and has a first pass band, and a second filter that is provided on the substrate having piezoelectricity and has a second pass band at a higher frequency than the first pass band. In the acoustic wave device, the first filter includes resonators that include respective interdigital transducer (IDT) electrodes and the second filter includes resonators that include respective IDT electrodes. In addition, when a first total average metallization ratio is defined as an average of metallization ratios of all of the IDT electrodes included in the first filter and a second total average metallization ratio is defined as an average of metallization ratios of all of the IDT electrodes included in the second filter, the first total average metallization ratio is greater than the second total average metallization ratio.

According to a preferred embodiment of the present invention, an acoustic wave device includes a substrate having piezoelectricity, a first filter that is provided on the substrate having piezoelectricity and has a first pass band, and a second filter that is provided on the substrate having piezoelectricity and has a second pass band at a higher frequency than the first pass band. In the acoustic wave device, the first filter includes resonators that include respective IDT electrodes and the second filter includes resonators that includes respective IDT electrodes. In addition, a resonator having the greatest average metallization ratio of the IDT electrode thereof among resonators included in the first filter and the second filter is the longest resonator in the first filter in a propagation direction of acoustic wave.

In an acoustic wave device according to a preferred embodiment of the present invention, the second filter may include a resonator having the smallest average metallization ratio of the IDT electrode thereof among resonators included in the first filter and the second filter.

In an acoustic wave device according to a preferred embodiment of the present invention, a frequency difference between a higher end of the first pass band and a lower end of the second pass band may be larger than or equal to a narrower one of a band width of the first pass band and a band width of the second pass band. In this case, the first pass band is at an even lower frequency than the second pass band, and the lengths of resonators for the first pass band tend to be longer in the propagation direction of acoustic wave. Preferred embodiments of the present invention are preferably applicable in such a case so that the size of the acoustic wave device is able to be effectively reduced.

In an acoustic wave device according to a preferred embodiment of the present invention, the first pass band and the second pass band may be pass bands for different communication bands.

The acoustic wave device according to preferred embodiments of the present invention may be a duplexer in which the first pass band and the second pass band are pass bands for the same communication band.

In an acoustic wave device according to a preferred embodiment of the present invention, the IDT electrodes included in the first filter may have a film thickness the same or substantially the same as that of the IDT electrodes included in the second filter. In this case, the IDT electrodes of the first and second filters are provided simultaneously. Accordingly, the IDT electrodes are able to be formed in a single step, which further improves production efficiency.

The acoustic wave device according to a preferred embodiment of the present invention may further include multiple bumps to be used in mounting the acoustic wave device. The bumps may be disposed in line symmetry with respect to at least one of a center line of the acoustic wave device extending in a propagation direction of acoustic wave and a center line thereof extending in a direction orthogonally or substantially orthogonally intersecting the propagation direction of acoustic wave. In this case, the acoustic wave device has a symmetric arrangement of the bumps that are portions to be joined to the mounting substrate. While the acoustic wave device is mounted on a device such as a mounting substrate, stresses may act on the mounting substrate. With the above configuration, the stresses are able to be dispersed effectively. Accordingly, the acoustic wave device is able to be joined to the mounting substrate more reliably, and the module equipped with the acoustic wave device is not readily subjected to damage.

According to a preferred embodiment of the present invention, a method of manufacturing the acoustic wave device configured as described above includes providing a substrate having piezoelectricity, and forming the IDT electrodes of the first filter and the IDT electrodes of the second filter simultaneously on the substrate having piezoelectricity. In the step of forming the IDT electrodes, the IDT electrodes are formed such that the first total average metallization ratio is greater than the second total average metallization ratio.

According to a preferred embodiment of the present invention, a method of manufacturing the acoustic wave device configured as described above includes providing a substrate having piezoelectricity, and forming the IDT electrodes of the first filter and the IDT electrodes of the second filter simultaneously on the substrate having piezoelectricity. In the step of forming the IDT electrodes, the IDT electrodes are formed such that a resonator having the greatest average metallization ratio of the IDT electrode thereof among resonators included in the first filter and the second filter is the longest resonator in the first filter in the propagation direction of acoustic wave.

In the step of forming the IDT electrodes, the IDT electrodes may be formed such that the second filter includes a resonator having the smallest average metallization ratio of the IDT electrode thereof among resonators included in the first filter and the second filter.

In the method of manufacturing the acoustic wave device, the IDT electrodes included in the first filter may have a film thickness that is the same or substantially the same as that of the IDT electrodes included in the second filter.

According to the acoustic wave devices and the manufacturing methods of the acoustic wave device according to preferred embodiments of the present invention, the size of the acoustic wave device is able to be reduced, and the efficiency of production of the acoustic wave device is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described with reference to the drawings, through which the present invention will be elucidated.

Note that the preferred embodiments described herein are examples and configurations therein may be partially replaced with each other or combined with each other between different preferred embodiments.

Figure 1:
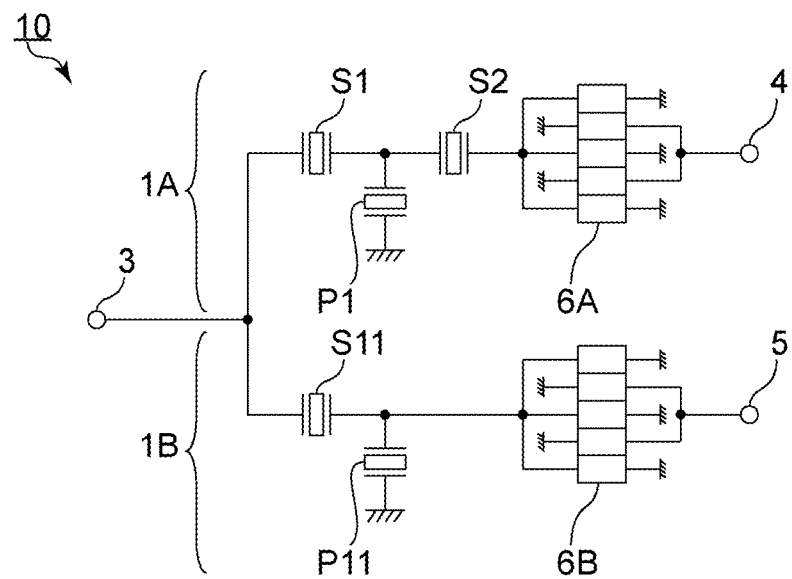
FIG. 1 is a diagram illustrating a circuit of an acoustic wave device according to a first preferred embodiment of the present invention.

FIG. 1 is a circuit diagram of an acoustic wave device according to a first preferred embodiment of the present invention.

An acoustic wave device 10 of the present preferred embodiment is preferably a dual filter, for example, including a first band pass filter 1A and a second band pass filter 1B. The first band pass filter 1A has a first pass band. The second band pass filter 1B has a second pass band at a higher frequency than the first pass band. In the present preferred embodiment, the first and second band pass filters 1A and 1B are preferably receiving filters.

More specifically, the first pass band is preferably, for example, a receive band of Band 20 covering a range from about 791 MHz or more and about 821 MHz or less. The second pass band is preferably, for example, a receive band of Band 8 covering a range from about 925 MHz or more and about 960 MHz or less. In the acoustic wave device 10, the first pass band and the second pass band are pass bands for different communication bands. However, the first and second pass bands are not limited to the above bands. It is sufficient that at least the second pass band is at a higher frequency than the first pass band.

As illustrated in FIG. 1, the acoustic wave device 10 includes an antenna terminal 3 to be connected to an antenna. The first band pass filter 1A and the second band pass filter 1B are commonly connected to the antenna terminal 3. The acoustic wave device 10 also includes a first signal terminal 4 that is connected to the first band pass filter 1A and a second signal terminal 5 that is connected to the second band pass filter 1B.

The first band pass filter 1A includes a longitudinally coupled resonator acoustic wave filter 6A that is connected between the antenna terminal 3 and the first signal terminal 4. An acoustic wave resonator S1 and an acoustic wave resonator S2 are connected in series with each other between the antenna terminal 3 and the longitudinally coupled resonator acoustic wave filter 6A. An acoustic wave resonator P1 is connected between a ground potential and a node between the acoustic wave resonator S1 and the acoustic wave resonator S2. The acoustic wave resonator S1, the acoustic wave resonator S2, and the acoustic wave resonator P1 are preferably acoustic wave resonators for characteristics adjustment.

On the other hand, the second band pass filter 1B includes a longitudinally coupled resonator acoustic wave filter 6B that is connected between the antenna terminal 3 and the second signal terminal 5. An acoustic wave resonator S11 is connected between the antenna terminal 3 and the longitudinally coupled resonator acoustic wave filter 6B. An acoustic wave resonator P11 is connected between the ground potential and a node between the acoustic wave resonator S11 and the longitudinally coupled resonator acoustic wave filter 6B. The acoustic wave resonator S11 and the acoustic wave resonator P11 are preferably acoustic wave resonators for characteristics adjustment.

Accordingly, the first band pass filter 1A and the second band pass filter 1B are filters each including multiple resonators. Here, in the present description, the term "resonator" encompasses the acoustic wave resonator and the longitudinally coupled resonator acoustic wave filter.

The present preferred embodiment will be described more specifically below.

Figure 2:
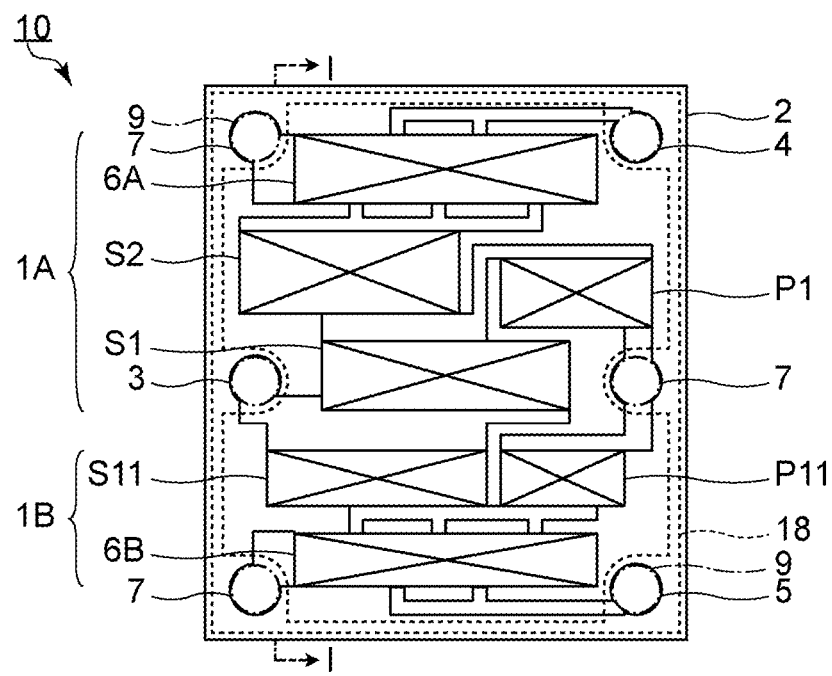
FIG. 2 is a plan view schematically depicting a circuit configuration of the acoustic wave device according to the first preferred embodiment of the present invention.

FIG. 2 is a plan view schematically depicting a circuit configuration of the acoustic wave device according to the first preferred embodiment of the present invention. In FIG. 2, resonators are represented schematically by rectangles having two diagonals.

The acoustic wave device 10 includes a piezoelectric substrate 2, which is a substrate having piezoelectricity. The piezoelectric substrate 2 preferably has a rectangular or substantially rectangular plate shape. The piezoelectric substrate 2 is preferably made of, for example, a single-crystal piezoelectric material, such as LiNbO$_3$ and LiTaO$_3$, or any suitable piezoelectric ceramics. Note that a piezoelectric substrate in which a piezoelectric film is laminated on a support substrate may be used as the substrate having piezoelectricity. The piezoelectric film may be made of the above single-crystal piezoelectric material.

The first and second band pass filter 1A and 1B are provided on the piezoelectric substrate 2. Multiple ground terminals 7 are disposed on the piezoelectric substrate 2. The ground terminals 7 are connected to the ground potential. In the present preferred embodiment, the acoustic wave resonator P1 and the acoustic wave resonator P11 are connected to the same ground terminal 7. However, the acoustic wave resonator P1 and the acoustic wave resonator P11 need not be connected to the same ground terminal 7, and may be connected to different ground terminals.

Figure 3:
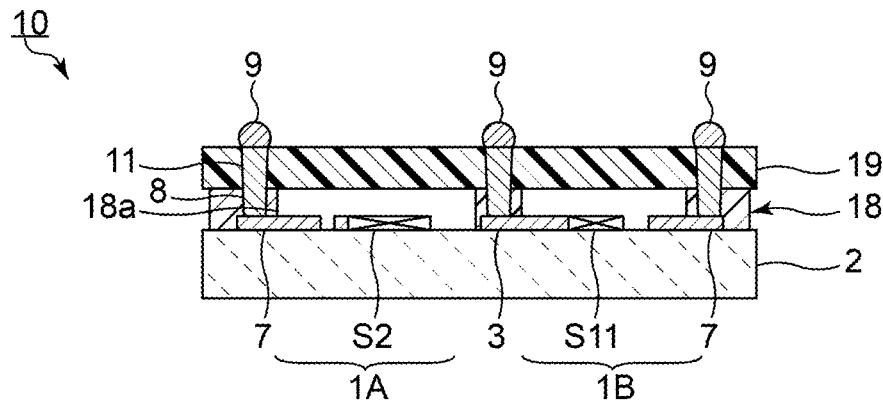
FIG. 3 is a schematic cross section of the acoustic wave device cut along line I-I in FIG. 2.

FIG. 3 is a schematic cross section of the acoustic wave device that is cut along line I-I in FIG. 2.

The acoustic wave device 10 is preferably, for example, an acoustic wave device having a structure of wafer level package (WLP). A support member 18 is preferably disposed on the piezoelectric substrate 2 so as to surround the acoustic wave resonators S2 and S11 and other resonators. The support member 18 includes a cavity 18a that surrounds the resonators. The support member 18 is preferably made, for example, of a resin.

A cover member 19 is preferably provided on the support member 18 so as to cover the cavity 18a of the support member 18. The support member 18 is disposed on the antenna terminal 3, the first signal terminal, the second signal terminal, and the ground terminals 7. The resonators are arranged in a hollow space surrounded by the piezoelectric substrate 2, the support member 18, and the cover member 19.

Via holes 11 are provided to pass through the cover member 19 and the support member 18. A via electrode 8 is preferably provided in each of the via holes 11. Each via electrode 8 includes one end connected to a terminal. Each via electrode 8 includes another end on which a bump 9 is disposed. The bump 9 is preferably used in mounting the acoustic wave device 10. Note that the acoustic wave device 10 may include bumps 9 that are not electrically connected to resonators. In FIG. 2, the support member 18 is indicated by dashed lines, and the bumps 9 are indicated by dash-dot lines.

The acoustic wave device 10 is mounted on and connected to a mounting substrate using the bumps 9. In the present preferred embodiment, the resonators are electrically connected to external devices through the terminals, the via electrodes 8, and the bumps 9. Note that the acoustic wave device 10 is not limited to the device having the WLP structure but may have a structure of chip size package (CSP), for example.

Figure 4:
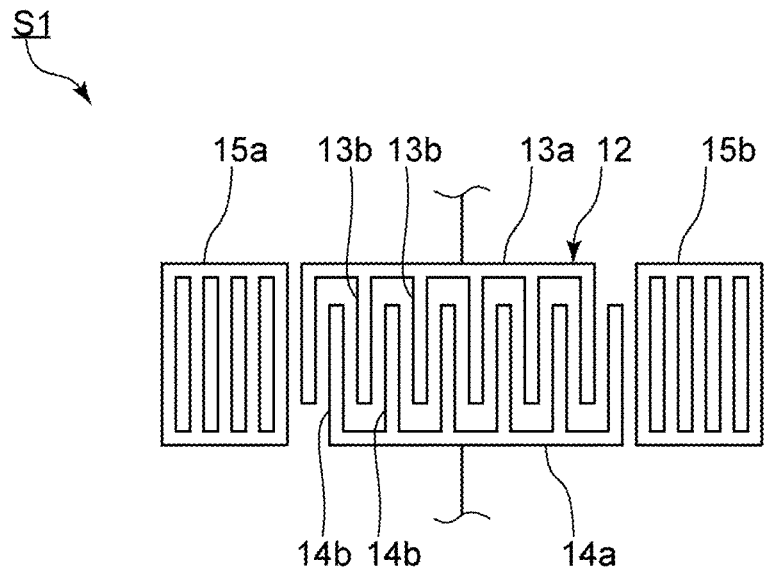
FIG. 4 is a plan view schematically illustrating an electrode configuration of an acoustic wave resonator that is located closest to an antenna terminal in a first band pass filter according to the first preferred embodiment of the present invention.

FIG. 4 is a plan view schematically illustrating an electrode configuration of the acoustic wave resonator that is located closest to the antenna terminal in the first band pass filter according to the first preferred embodiment.

The acoustic wave resonator S1 includes an interdigital transducer (IDT) electrode 12 provided on the piezoelectric substrate. The IDT electrode 12 preferably includes a first busbar 13a and a second busbar 14a, and the first busbar 13a and the second busbar 14a oppose each other. The IDT electrode 12 preferably includes multiple first electrode fingers 13b with respective one ends connected to the first busbar 13a. The IDT electrode 12 also includes multiple second electrode fingers 14b having respective one ends connected to the second busbar 14a. The first electrode fingers 13b and the second electrode fingers 14b are interdigitated with each other.

When an alternating voltage is applied to the IDT electrode 12, an acoustic wave is generated. Reflectors 15a and 15b are preferably disposed on respective side regions adjoining the IDT electrode 12 in the propagation direction of acoustic wave. The acoustic wave resonator S1 is thus structured. Similarly, other acoustic wave resonators in the acoustic wave device 10 also include respective IDT electrodes and reflectors.

Figure 5:
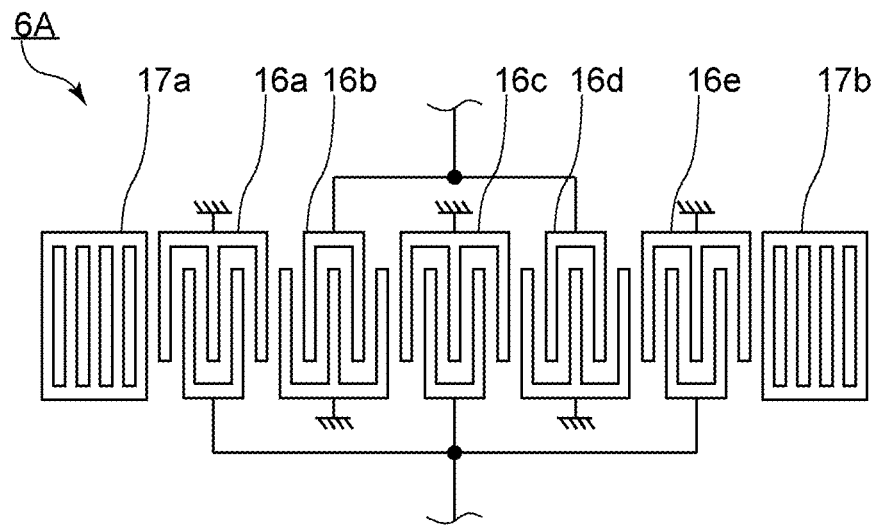
FIG. 5 is a plan view schematically illustrating an electrode configuration of a longitudinally coupled resonator acoustic wave filter included in the first band pass filter according to the first preferred embodiment of the present invention.

FIG. 5 is a plan view schematically illustrating an electrode configuration of a longitudinally coupled resonator acoustic wave filter included in the first band pass filter according to the first preferred embodiment.

The longitudinally coupled resonator acoustic wave filter 6A preferably includes an IDT electrode 16a, an IDT electrode 16b, an IDT electrode 16c, an IDT electrode 16d, and an IDT electrode 16e, and these IDT electrodes are provided on the piezoelectric substrate. Reflectors 17a and 17b are preferably disposed on respective side regions adjoining the five IDT electrodes 16a to 16e in the propagation direction of acoustic wave. Similarly, the longitudinally coupled resonator acoustic wave filter 6B in the second band pass filter 1B illustrated in FIG. 1 also preferably includes five IDT electrodes and two reflectors. Note that the number of IDT electrodes included in the longitudinally coupled resonator acoustic wave filters 6A and 6B is not limited to the number described above but may be, for example, three.

In the present preferred embodiment, the film thickness of each IDT electrode in the first band pass filter 1A is preferably the same or substantially the same as the film thickness of each IDT electrode in the second band pass filter 1B. Note that when the film thicknesses are described as being the same or substantially the same in the present specification, the film thicknesses may include allowances to a degree at which the filter characteristics are not degraded.

Here, a preferred average metallization ratio of IDT electrode of each resonator illustrated in FIG. 1 is listed, for example, as follows: about 0.6 for the acoustic wave resonator S1; about 0.6 for the acoustic wave resonator S2; about 0.6 for the acoustic wave resonator P1; about 0.65 for the longitudinally coupled resonator acoustic wave filter 6A; about 0.4 for the acoustic wave resonator S11; about 0.4 for the acoustic wave resonator P11; and about 0.5 for the longitudinally coupled resonator acoustic wave filter 6B.

When $A_d$ is denoted as an average metallization ratio of one resonator, $S_f$ is denoted as a sum of widths of all the first electrode fingers and the second electrode fingers included in the IDT electrode of the resonator, and $W_I$ is denoted as a length of the IDT electrode in the propagation direction of acoustic wave. The average metallization ratio $A_d$ may be calculated as $A_d = S_f/W_I$. In the present specification, the width of each first electrode finger and the width of each second electrode finger are dimensions measured in the propagation direction of acoustic wave.

When a first total average metallization ratio is defined as an average of the metallization ratios of all of the IDT electrodes included in the first band pass filter 1A, the first total average metallization ratio is preferably about 0.614, for example. When a second total average metallization ratio is defined as an average of the metallization ratios of all the IDT electrodes included in the second band pass filter 1B, the second total average metallization ratio is preferably about 0.427, for example.

When $TA_1$ is denoted as the first total average metallization ratio, $SA_1$ is denoted as a sum of average metallization ratios $A_d$ of all of the resonators included in the first band pass filter 1A, and $N_1$ is denoted as the total number of resonators included in the first band pass filter 1A. The first total average metallization ratio $TA_1$ may be calculated as $TA_1 = SA_1/N_1$. Similarly, when $TA_2$ is denoted as the second total average metallization ratio, $SA_2$ is denoted as a sum of average metallization ratios $A_d$ of all of the resonators included in the second band pass filter 1B, and $N_2$ is denoted as the total number of resonators included in the second band pass filter 1B. The second total average metallization ratio $TA_2$ may be calculated as $TA_2 = SA_2/N_2$.

The average metallization ratios in the first band pass filter 1A and the first total average metallization ratio are shown in Table 1 below. The average metallization ratios in the second band pass filter 1B and the second total average metallization ratio are shown in Table 2 below. Note that the number of electrode fingers included in the IDT electrode of each resonator is also listed in Table 1 and Table 2.

TABLE 1

|  | The total number of electrode fingers | Average metallization ratio | First total average metallization ratio |
|---|---|---|---|
| Acoustic wave resonator S1 | 180 | 0.6 | 0.614 |
| Acoustic wave resonator P1 | 100 | 0.6 | |
| Acoustic wave resonator S2 | 140 | 0.6 | |
| Longitudinally coupled resonator acoustic wave filter 6A | 160 | 0.65 | |

TABLE 2

|  | The total number of electrode fingers | Average metallization ratio | Second total average metallization ratio |
|---|---|---|---|
| Acoustic wave resonator S11 | 250 | 0.4 | 0.427 |
| Acoustic wave resonator | 100 | 0.4 | |

TABLE 2-continued

|  | The total number of electrode fingers | Average metallization ratio | Second total average metallization ratio |
|---|---|---|---|
| P11 Longitudinally coupled resonator acoustic wave filter 6B | 131 | 0.5 | |

In a known band pass filter, the pitch of the electrode fingers of the IDT electrode tends to be wider as a pass band is shifted to lower frequencies due to the wavelength of an acoustic wave becoming longer. Accordingly, the length of a resonator in the propagation direction of acoustic wave becomes longer, which tends to increase the area that the resonator occupies in the acoustic wave device.

In the present specification, "acoustic velocity (V)" is defined as propagation velocity of acoustic wave in the propagation direction. "Frequency (f)" is defined as frequency in a pass band. "Electrode-finger pitch ($\lambda/2$)" is defined as pitch of electrode fingers in each IDT electrode. In the present invention, when the average metallization ratio increases, the acoustic velocity (V) obtained from $V = f \cdot \lambda$ decreases. Accordingly, when the frequency (f) of a pass band is constant, the acoustic velocity (V) decreases by increasing the average metallization ratio, which enables the electrode-finger pitch ($\lambda/2$) of an IDT electrode to be reduced.

Moreover, the acoustic wave device 10 of the present preferred embodiment is preferably the dual filter that includes the first band pass filter 1A and the second band pass filter 1B. The acoustic velocity (V1) in the first band pass filter 1A may be calculated as $V1 = f1 \times \lambda 1$, where f1 is the frequency in the first band pass filter 1A and $\lambda 1$ is the wavelength determined by the electrode-finger pitch in the first band pass filter 1A. The acoustic velocity (V2) in the second band pass filter 1B may be calculated as $V2 = f2 \times \lambda 2$, where f2 is the frequency in the second band pass filter 1B and $\lambda 2$ is the wavelength determined by the electrode-finger pitch in the second band pass filter 1B. In the present preferred embodiment, the second pass band is positioned at a higher frequency than the first pass band. Accordingly, when the acoustic velocities (V1 and V2) are constant, f1 is lower than f2, and $\lambda 1$ is longer than $\lambda 2$. In other words, the resonators in the first band pass filter 1A become longer in size in the propagation direction of acoustic wave and occupy a larger area in the acoustic wave device than the resonators in the second band pass filter 1B. In the present preferred embodiment, the resonators having the greatest average metallization ratio are used in the first band pass filter 1A that is longer in the dual filter in the propagation direction of acoustic wave. By doing so, the sizes of the resonators that need size reduction more pressingly are able to be reduced.

In the present preferred embodiment, the second pass band is positioned at a higher frequency than the first pass band, and the first total average metallization ratio is greater than the second total average metallization ratio. As a result, the acoustic velocity (V1) is able to be made slower in the resonators in the first band pass filter 1A, and accordingly the electrode-finger pitch ($\lambda/2$) of each IDT electrode is able to be made narrower. Thus, the size of the acoustic wave device 10 is able to be effectively reduced.

In addition, in the present preferred embodiment, the resonator having the greatest average metallization ratio of IDT electrode among resonators included in the first band pass filter 1A and the second band pass filter 1B is the longest resonator in the first band pass filter 1A in the propagation direction of acoustic wave. More specifically, the first band pass filter 1A, which has the first pass band at a lower frequency, preferably includes the longitudinally coupled resonator acoustic wave filter 6A that has the greatest average metallization ratio.

In the present preferred embodiment, the longitudinally coupled resonator acoustic wave filter 6A occupies the largest area among the resonators in the first band pass filter 1A. As described, it is preferable that the resonator occupying the largest area in the first band pass filter 1A has the greatest average metallization ratio. Thus, the size of the acoustic wave device 10 is able to be more effectively reduced.

Moreover, in the present preferred embodiment, the second band pass filter 1B, which has the second pass band at a higher frequency, preferably includes the acoustic wave resonators S11 and P11 that have the smallest average metallization ratio. In other words, the first band pass filter 1A, which has the pass band at a lower frequency, does not include resonators having the smallest average metallization ratio. Thus, the acoustic velocity is able to be reduced in all of the resonators in the first band pass filter 1A, which reduces the electrode-finger pitch ($\lambda/2$) of each IDT electrode. In the first band pass filter 1A, which is longer in size in the propagation direction of acoustic wave, the electrode-finger pitch ($\lambda/2$) of each IDT electrode is able to be made narrower, and the size of the acoustic wave device 10 is able to be effectively reduced.

Note that the acoustic wave device 10 preferably includes a resonator having a smaller average metallization ratio than the average metallization ratio of the longitudinally coupled resonator acoustic wave filter 6A. It is more preferable that the longitudinally coupled resonator acoustic wave filter 6A has the greatest average metallization ratio. This reduces the electrode-finger pitch ($\lambda/2$) of the longitudinally coupled resonator acoustic wave filter 6A and is increases the total number of the electrode fingers of the IDT electrodes while reducing the size. In this case, for example, the number of IDT electrodes is able to be increased. Here, an "intersecting region" is defined as a region in which adjacent electrode fingers of an IDT electrode overlap each other as viewed in the propagation direction of acoustic wave. An "intersecting width" is defined as the length of the interdigitating region in the direction orthogonally or substantially orthogonally intersecting the propagation direction of acoustic wave. Since the total number of electrode fingers in the longitudinally coupled resonator acoustic wave filter 6A is able to be increased as described above, the intersecting width of the IDT electrode is able to be reduced without degrading performance. As a result, the electric resistance of the electrode fingers of the IDT electrode is able to be reduced, which decreases the insertion loss.

In the present preferred embodiment, as illustrated in FIG. 2, the acoustic wave resonators S2 and P1 are preferably arranged in the propagation direction of acoustic wave on the piezoelectric substrate 2. The portion that the acoustic wave resonators S2 and P1 occupy is longer than any other portions that resonators occupy in the first band pass filter 1A with respect to the length of the piezoelectric substrate 2 in the propagation direction of acoustic wave. It is preferable that the acoustic wave device 10 includes a resonator that has an average metallization ratio smaller than the average metallization ratio of at least one of the acoustic wave resonator S2 and the acoustic wave resonator P1. The size of the acoustic wave device 10 is thus able to be effectively reduced.

In the present preferred embodiment, the frequency at the highest end of the first pass band is preferably about 821 MHz, and the frequency at the lowest end of the second pass band is preferably about 925 MHz, for example. The difference between these frequencies is preferably about 104 MHz, for example. The narrower one of the band widths of the first and second pass bands is preferably about 30 MHz, for example. It is preferable that the frequency difference between the highest end of the first pass band and the lowest end of the second pass band is larger than or equal to the narrower one of the band widths of the first and second pass bands. In this case, the first pass band has a lower frequency than the second pass band, and the lengths of resonators for the first pass band tend to be longer in the propagation direction of acoustic wave. The present invention is preferably applicable in this case so that the size of the acoustic wave device is able to be effectively reduced.

In the present preferred embodiment, the first and second band pass filters 1A and 1B are receiving filters. Note that at least one of the first and second band pass filters 1A and 1B may be a transmitting filter. The acoustic wave device 10 may be a duplexer in which the first pass band and the second pass band are pass bands for the same communication band.

A non-limiting example of a method of manufacturing the acoustic wave device according to the present preferred embodiment will be described.

FIGS. 6A to 6D are schematic cross sections of the acoustic wave device cut along line I-I in FIG. 2. These figures are provided to explain a non-limiting example of a method of manufacturing the acoustic wave device according to the first preferred embodiment. In FIGS. 6A to 6D, the resonators are represented schematically by rectangles having two diagonals.

Figure 6A:
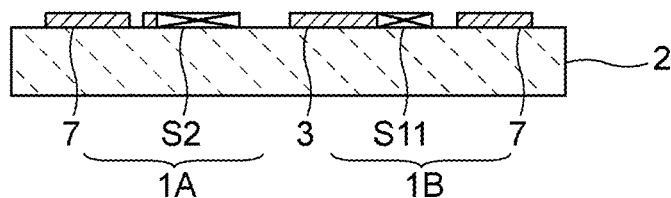
FIGS. 6A to 6D are schematic cross sections of the acoustic wave device cut along line I-I in FIG. 2 that explain a non-limiting example of a method of manufacturing the acoustic wave device according to the first preferred embodiment of the present invention.

First, as illustrated in FIG. 6A, the piezoelectric substrate 2 is prepared. Next, multiple IDT electrodes and reflectors, multiple terminals including the antenna terminal 3 and the ground terminals 7, and wiring are provided on the piezoelectric substrate 2. The IDT electrodes, the reflectors, the terminals, and the wiring may preferably be formed, for example, by using sputtering or vacuum evaporation.

Here, it is preferable that the IDT electrodes of the first band pass filter 1A and the IDT electrodes of the second band pass filter 1B is formed simultaneously so as to have at least one of the following configurations 1) to 3). 1) the second pass band of the second band pass filter 1B is at a higher frequency than the first pass band of the first band pass filter 1A, and the first total average metallization ratio is greater than the second total average metallization ratio. 2) Among resonators included in the first band pass filter 1A and the second band pass filter 1B, the resonator having the greatest average metallization ratio of IDT electrode is the longest resonator in the first band pass filter 1A in the propagation direction of acoustic wave. It is more preferable that the IDT electrodes are formed simultaneously so as to have the following configuration in addition to those described above. 3) the second band pass filter 1B includes at least one resonator having the smallest average metallization ratio. Since the second pass band of the second band pass filter 1B is at a higher frequency, the electrode-finger pitches of the IDT electrodes become narrower, but the metallization ratios of the IDT electrodes are small in the present preferred embodiment. As a result, even if the IDT electrodes of the first band pass filter 1A and the IDT electrodes of the second band pass filter 1B are formed simultaneously, defective formation of IDT electrode does not occur easily. This enable further reduction in the size of the device and also effectively improves productivity.

In the present preferred embodiment, the IDT electrodes of the first and second band pass filters 1A and 1B are preferably formed simultaneously so as to have all of the configurations 1) to 3) above. In this case, the size of the device is able to be further reduced and productivity is able to be effectively improved.

Figure 6B:
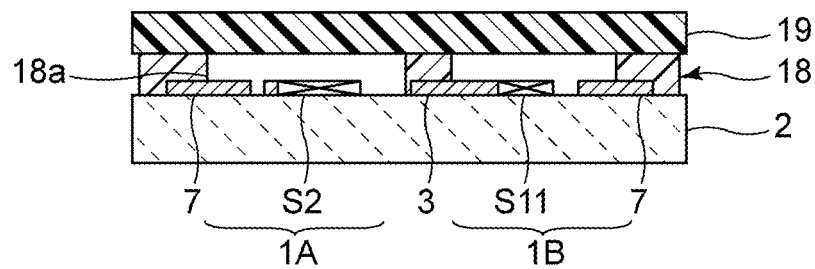

Next, as illustrated in FIG. 6B, the support member 18 including the cavity 18a is formed on the piezoelectric substrate so as to surround the resonators. The support member 18 is formed so as to cover multiple terminals including the antenna terminal 3 and the ground terminals 7. The support member 18 may preferably be formed, for example, by using photo lithography. Next, the cover member 19 is disposed on the support member 18 so as to cover the cavity 18a of the support member 18.

Figure 6C:
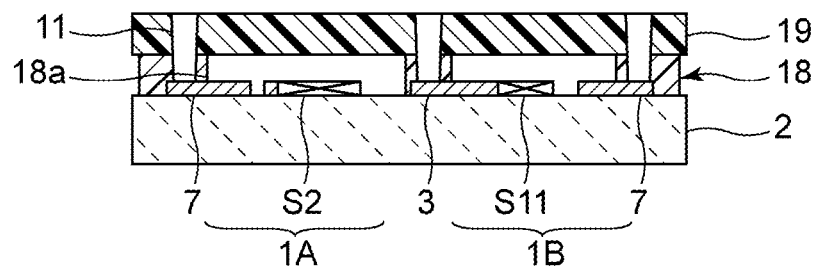

As illustrated in FIG. 6C, multiple via holes 11 are preferably subsequently formed so as to pass through the cover member 19 and the support member 18. The via holes 11 may preferably be formed, for example, by irradiation of laser light or by machining.

Figure 6D:
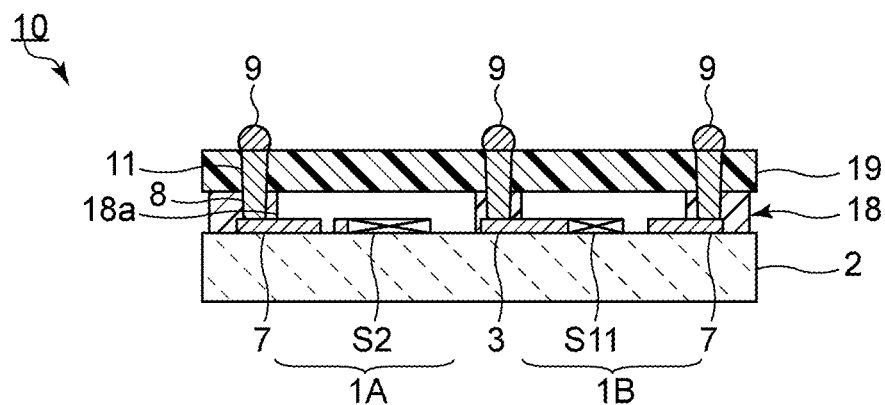

Next, as illustrated in FIG. 6D, the via electrodes 8 are formed in respective via holes 11, for example, by electroplating. Each via electrode 8 is formed so as to include one end connected to a corresponding terminal, such as the antenna terminal 3 or a ground terminal 7. A bump 9 is disposed so as to be joined to the other end of the via electrode 8.

Figure 7:
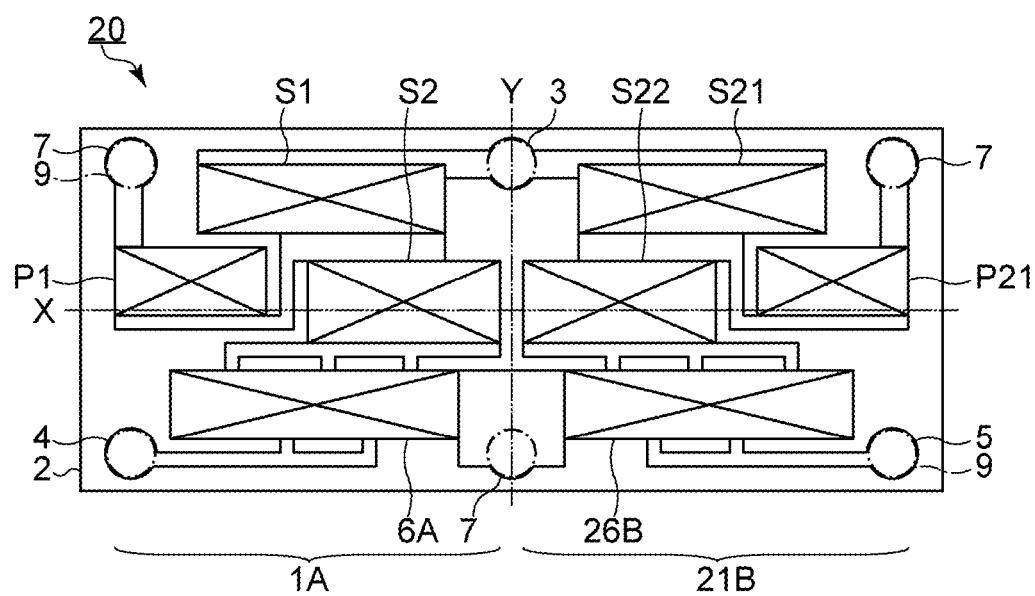
FIG. 7 is a plan view schematically depicting an electrode configuration of an acoustic wave device according to a second preferred embodiment of the present invention.

FIG. 7 is a plan view schematically depicting an electrode configuration of an acoustic wave device according to a second preferred embodiment.

The present preferred embodiment is different from the first preferred embodiment in the arrangement of first and second band pass filters 1A and 21B and in the circuit configuration of the second band pass filter 21B. Accordingly, the bumps 9 are also arranged differently from those in the first preferred embodiment. Except for these points, an acoustic wave device 20 have a configuration the same as or similar to that of the acoustic wave device 10 according to the first preferred embodiment.

Note that the piezoelectric substrate 2 preferably has a rectangular or substantially rectangular shape as viewed in plan view. In the plan view of the piezoelectric substrate 2, two of the four sides extend in a direction parallel or substantially parallel to the propagation direction of acoustic wave. The other two of the four sides extend in a direction orthogonally or substantially orthogonally intersecting the propagation direction of acoustic wave. One of the two dash-dot-dot lines in FIG. 7 is a center line X of the acoustic wave device 20 extending in the propagation direction of acoustic wave. The other one of the two dash-dot-dot lines in FIG. 7 is a center line Y of the acoustic wave device 20 extending in the direction orthogonally or substantially orthogonally intersecting the propagation direction of acoustic wave. Note that the directions in which the sides of the piezoelectric substrate 2 extend are not limited to the above.

In the present preferred embodiment, the first band pass filter 1A and a second band pass filter 21B are preferably arranged side by side in the propagation direction of acoustic wave. The second band pass filter 21B includes a longitudinally coupled resonator acoustic wave filter 26B that is connected between the antenna terminal 3 and the second signal terminal 5. An acoustic wave resonator S21 and an acoustic wave resonator S22 are connected in series with each other between the antenna terminal 3 and the longitudinally coupled resonator acoustic wave filter 26B. An acoustic wave resonator P21 is connected between a ground potential and a node between the acoustic wave resonator S21 and the acoustic wave resonator S22. The pass band of the second band pass filter 21B is the receive band of Band 8 as is similar to the first preferred embodiment.

The average metallization ratios of the resonators included in the second band pass filter 21B and the second total average metallization ratio are shown in Table 3 below. Note that the total number of electrode fingers included in the IDT electrode of each resonator is also listed in Table 3.

TABLE 3

| | The total number of electrode fingers | Average metallization ratio | First total average metallization ratio |
|---|---|---|---|
| Acoustic wave resonator S21 | 180 | 0.4 | 0.428 |
| Acoustic wave resonator P21 | 100 | 0.4 | |
| Acoustic wave resonator S22 | 140 | 0.4 | |
| Longitudinally coupled resonator acoustic wave filter 26B | 160 | 0.5 | |

The acoustic wave device 20 also has the above configurations 1) to 3) as is the case for the first preferred embodiment. This reduces the length of each resonator in the propagation direction of acoustic wave in the first band pass filter 1A that includes the first pass band at a lower frequency than the second pass band. Thus, the size of the acoustic wave device 20 is able to be further reduced.

Moreover, in the present preferred embodiment, multiple bumps 9 are preferably disposed in line symmetry with respect to the center line X that extends in the propagation direction of acoustic wave, and the multiple bumps 9 are also disposed in line symmetry with respect to the center line Y that extends in the direction orthogonally or substantially orthogonally intersecting the propagation direction of acoustic wave. With this configuration, the acoustic wave device 20 preferably includes a symmetric arrangement of the bumps 9 that are portions to be joined to the mounting substrate. When a stress acts, for example, on the acoustic wave device 20 or the mounting substrate, the stress is effectively dispersed. Accordingly, the acoustic wave device 20 is able to be joined to the mounting substrate more reliably, and the module on which the acoustic wave device 20 is mounted is not easily subjected to damage.

In the present preferred embodiment, as described above, the length of each resonator in the propagation direction of acoustic wave is able to be reduced, which increases the degree of freedom of electrode arrangement. Thus, the size of the device is reduced, and multiple bumps 9 are disposed in line symmetry with respect to the center line X and the center line Y.

It is sufficient that at least a portion of the multiple bumps 9 are disposed in line symmetry with respect at least to one of the center line X and the center line Y. Stresses are also able to be dispersed in this case.

The first filter and the second filter of the present invention have been described, by way of example, as band pass filters in the first and second preferred embodiments. However, the first filter and the second filter are not limited to the band pass filters. The first filter and the second filter may be, for example, a low pass filter or a high pass filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a substrate having piezoelectricity;
    a first band pass filter that is provided on the substrate having piezoelectricity and has a first pass band; and
    a second band pass filter that is provided on the substrate having piezoelectricity and has a second pass band at a higher frequency than the first pass band; wherein
    the first band pass filter includes a plurality of resonators each including at least one interdigital transducer (IDT) electrode and the second band pass filter includes a plurality of resonators each including at least one IDT electrode; and
    a resonator having a greatest average metallization ratio of the at least one IDT electrode thereof among the resonators included in the first band pass filter and the second band pass filter is a longest resonator in the first band pass filter in a propagation direction of acoustic wave, the average metallization ratio of the longest resonator being greater than the average metallization ratio of each resonator in the first band pass filter and the second band pass filter.

2. The acoustic wave device according to claim 1, wherein the first band pass filter and the second band pass filter are provided on a same side surface of a piezoelectric substrate.

3. The acoustic wave device according to claim 2, wherein components defining the first band pass filter and the second band pass filter are surrounded by a support member provided on the same side surface of the piezoelectric substrate.

4. The acoustic wave device according to claim 3, wherein the components defining the first band pass filter and the second band pass filter are housed in a cavity defined between the support member, the piezoelectric substrate, and a cover member provided on the support member.

5. The acoustic wave device according to claim 1, further comprising:
    an antenna terminal electrically connected to an antenna; wherein
    the first band pass filter and the second band pass filter are both directly commonly connected to the antenna terminal.

6. The acoustic wave device according to claim 5, further comprising:
    a first signal terminal; and
    a second signal terminal; wherein
    the first band pass filter is electrically connected in series between the first signal terminal and the antenna terminal; and
    the second band pass filter is electrically connected in series between the second signal terminal and the antenna terminal.

7. The acoustic wave device according to claim 1, wherein the plurality of resonators of the first band pass filter includes a plurality of series acoustic wave resonators connected in series with one another and at least one parallel acoustic wave resonator connected between a ground potential and a node between ones of the plurality of series acoustic wave resonators.

8. The acoustic wave device according to claim 7, wherein the plurality of resonators of the second band pass filter includes a single series acoustic wave resonator and a single parallel acoustic wave resonator that is connected between a ground potential and a node connected to the single series acoustic wave resonator.

9. The acoustic wave device according to claim 1, wherein the second band pass filter includes a resonator having a smallest average metallization ratio of the at least one IDT electrode thereof among the resonators included in the first filter and the second filter.

10. The acoustic wave device according to claim 1, wherein a frequency difference between a higher end of the first pass band and a lower end of the second pass band is larger than or equal to a narrower one of a band width of the first pass band and a band width of the second pass band.

11. The acoustic wave device according to claim 1, wherein the first pass band and the second pass band are pass bands for different communication bands.

12. The acoustic wave device according to claim 1, wherein the acoustic wave device is a duplexer in which the first pass band and the second pass band are pass bands for a same communication band.

13. The acoustic wave device according to claim 1, wherein the at least one IDT electrode included in the first band pass filter has a film thickness the same or substantially the same as that of the at least one IDT electrode included in the second band pass filter.

14. The acoustic wave device according to claim 1, further comprising:
    a plurality of bumps to be used in mounting the acoustic wave device; wherein
    the plurality of bumps are disposed in line symmetry with respect to at least one of a center line of the acoustic wave device extending in a propagation direction of acoustic wave and a center line thereof extending in a direction orthogonally or substantially orthogonally intersecting the propagation direction of acoustic wave.

15. The acoustic wave device according to claim 1, wherein the first pass band covers a range from about 791 MHz or more and about 821 MHz or less, and the second pass band covers a range from about 925 MHz or more and about 960 MHz or less.

* * * * *